United States Patent [19]

Requejo

[11] Patent Number: 4,689,168
[45] Date of Patent: Aug. 25, 1987

[54] HARD SURFACE CLEANING COMPOSITION

[75] Inventor: Luz P. Requejo, Cincinnati, Ohio

[73] Assignee: The Drackett Company, Cincinnati, Ohio

[21] Appl. No.: 721,268

[22] Filed: Apr. 9, 1985

[51] Int. Cl.$^4$ .................. C11D 1/82; C11D 1/83; C11D 3/44

[52] U.S. Cl. .................. 252/139; 252/546; 252/548; 252/550; 252/551; 252/554; 252/555; 252/557; 252/558; 252/559; 252/173; 252/171; 252/174.15; 252/174.21; 252/DIG. 14; 252/DIG. 15; 252/153

[58] Field of Search ............ 252/89.1, 174.15, 174.21, 252/171, DIG. 15, 546, 550, 139, DIG. 14, 153

[56] References Cited

U.S. PATENT DOCUMENTS

| | | | |
|---|---|---|---|
| 3,095,381 | 6/1963 | Tinnon et al. | 252/174.21 |
| 3,463,735 | 8/1969 | Stonebraker et al. | 252/532 |
| 3,511,708 | 5/1970 | Zisman et al. | 134/40 |
| 3,516,938 | 6/1970 | Zisman et al. | 252/171 |
| 3,696,043 | 10/1972 | Labarge | 252/153 |
| 3,819,522 | 6/1974 | Zmoda et al. | 252/89.1 |
| 3,979,317 | 9/1976 | Angelini | 252/170 |
| 4,005,025 | 1/1977 | Kinstedt | 252/547 X |
| 4,005,030 | 1/1977 | Heckert et al. | 252/140 |
| 4,054,534 | 10/1977 | Angelini | 252/171 |
| 4,075,118 | 2/1981 | Gault et al. | 252/135 |
| 4,269,739 | 5/1981 | Grejsner | 252/547 |
| 4,287,080 | 9/1981 | Siklosi | 252/104 |
| 4,302,348 | 11/1981 | Requejo | 252/135 |
| 4,438,026 | 3/1984 | Tajkowski | 252/545 |
| 4,511,489 | 4/1985 | Requejo | 252/172 |

FOREIGN PATENT DOCUMENTS 2360236 6/1975 Fed. Rep. of Germany .

Primary Examiner—Prince E. Willis
Attorney, Agent, or Firm—Charles J. Zeller

[57] ABSTRACT

A hard surface cleaning composition forming upon agitation a relatively unstable emulsion breakable when applied to the hard surface to be cleaned comprising on a weight basis from about 2 to about 10% of an organic polar solvent; from about 0.1 to about 2.0% of a volatile organosiloxane; from about 0.1 to about 2.0% of a volatile surfactant having the formula:

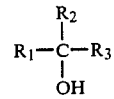

wherein $R_1$ is an alkynyl of from 2 to 5 carbons; $R_2$ is hydrogen or an alkyl of less than 4 carbons, and $R_3$ is an alkyl or hydroxy alkyl of from 1 to 8 carbons, the total number of carbons being from 4 to 12, and water, the ratio of said volatile surfactant to said volatile organosiloxane being between about 3:1 to about 1:3. The preferred volatile surfactant is 3,5-dimethyl-1-hexyn-3-ol, while the preferred siloxane is the dimethyl siloxane cyclic tetramer.

29 Claims, No Drawings

HARD SURFACE CLEANING COMPOSITION

FIELD OF INVENTION

The present invention concerns hard surface cleaning compositions of the type comprising an organic solvent, a surfactant, water, and various adjuvants. More specifically, the present invention concerns a hard surface cleaning composition forming with agitation an unstable emulsion breakable when applied to the hard surface to be cleaned, the composition further comprising a volatile alkyn-ol or alkyne-diol surfactant and a volatile organosiloxane. Most specifically, the present invention relates to a two-phase hard surface cleaning composition containing as the volatile surfactant a dimethyl-hexyn-ol and as the volatile silicone a low molecular weight organosiloxane oligomer.

BACKGROUND OF INVENTION

U.S. Pat. No. 3,095,381 to Tinnon, et al., discloses the incorporation of an alkyl-substituted tertiary acetylenic hexynol, specifically, 3,5-dimethyl-1-hexyn-3-ol, in a hard surface cleaning composition. Tinnon states that the wetting action of the hard surface cleaner containing the acetylenic hexynol is increased, while the foaming thereof is decreased. Tinnon further states that the hard surface cleaner described therein may contain an organic solvent, and describes two compositions each containing 35% by volume isopropanol, one of which also contains 7.25% by volume diethylene glycol monoethyl ether. Nonvolatile surfactants, for example, an alkyl phenyl ether of polyethylene glycol, may be incorporated in an amount of from 0.02 to 0.05% by volume.

U.S. Pat. No. 4,287,080 to Siklosi discloses detergent compositions, including a hard surface cleaner composition, consisting essentially of from 0.05 to 50% of a tertiary alcohol having at least 5 carbon atoms and less than 100 carbon atoms, the tertiary alcohols being selected, in minor part, from the group consisting of heterosubstituted or unsubstituted monohydric alcohols of the formula

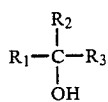

wherein $R_1$, $R_2$, and $R_3$ contain from 1 to 20 carbon atoms and are selected from a subgroup consisting of alkyl, alkenyl, alkynyl, cycloalkyl, carboxyl, carboxylate salt ester, carbonyl, ether, nitrile, aryl aralkyl, alkaryl, and aldehyde moieties, and combinations thereof. Alkyl-substituted tertiary acetylenic alkynols are contained within this class of the tertiary alcohols identified in Siklosi.

U.S. Pat. Nos. 3,979,317 and 4,054,534, both to Angelini, each disclose volatile cleaning solutions containing 3,5-dimethyl-1-hexyn-3-ol, which solutions are specifically adapted for cleaning electrophotographic mirrors and lenses, the solution consisting essentially of said tertiary alcohol, ultrapure water, a lower alcohol, and ammonia solution.

U.S. Pat. No. 3,463,735 to Stonebraker, et al., discloses an aqueous glass cleaning composition consisting essentially of a solvent system containing about 0.5 to 5% of a lower aliphatic alcohol and about 0.5 to 5% of a higher boiling polar organic solvent; about 0.05 to 0.5% of a compatible surface active agent; about 0.005 to 0.5% of a polyphosphate builder salt, and ammonia.

U.S. Pat. No. 4,302,348 to Requejo discloses a hard surface cleaning composition which is an improvement of the Stonebroker patent, the improvement being the incorporation of a second surfactant which is an anionic or nonionic fluorinated hydrocarbon surfactant.

SUMMARY OF INVENTION

It is an object of the present invention to provide a volatile hard surface cleaning composition comprising an aqueous phase and solvent phase, said composition forming on shaking an unstable emulsion breakable when applied to the hard surface to be cleaned.

A further object of the present invention is to provide a hard surface cleaning composition that evaporates rapidly leaving little or no residue or film of cleaning agents on the surface thus cleaned.

It is another object to provide a hard surface cleaning composition that has superior wetting of the hard surface.

The primary object of the present invention is to provide a volatile hard surface cleaning composition of enhanced and superior efficacy in lifting and otherwise attacking grease and other soils.

These and other objects and advantages of the present invention will become readily apparent upon a reading of the detailed description of the invention, a summary of which follows.

The compositions of the present invention comprise an aqueous phase and an oil phase which, on shaking or mixing, form an emulsion of said phases that is breakable when applied to the surface to be cleaned. While not wishing to be bound by any particular theory, it is believed that the breaking of the emulsion coupled with the evaporation of the volatile constituents assists in the lifting of the interfacial layer of a soil, particularly a grease soil. In this regard the compositions of the present invention, when applied to the hard surface in emulsion form, exhibit a bubbling action as the original phases attempt to reform and as the volatile components evaporate from the thin film layer of composition on the hard surface.

More specifically, the composition comprises on a weight basis:

(a) from about 2.0 to about 10% of a polar organic solvent;
(b) from about 0 to about 2.5% of a nonvolatile surfactant;
(c) from about 0.1 to about 2.0% of a volatile surfactant which is an acetylenic alcohol or diol of the formula:

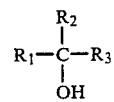

wherein $R_1$ is an alkynyl of from two to five carbon atoms; $R_2$ is hydrogen or an alkyl of less than four carbons, and $R_3$ is an alkyl or hydroxy alkyl of from one to eight carbons, the total number of carbons in the molecule being from four to twelve;

(d) from about 0.1 to about 2.0% of a volatile organosiloxane oligomer, the ratio of said volatile surfactant to said organosiloxane oligomer being from about 3:1 to about 1:3, and (e) the remainder water.

The composition of the present invention may also contain adjuvants such as dye, perfume, builder salts, alkalinity agents, and the like.

To clean a hard surface, the user shakes or otherwise mixes the composition thereby efficient the emulsion, and then applies the composition to the surface, for example, by a trigger spray applicator or aerosol nozzle, and wipes the surface with a sponge or cloth. Preferably, the user should wipe the applied composition from the surface a short period of time, e.g., several seconds, after application.

DETAILED DESCRIPTION OF INVENTION

The present invention concerns a hard surface cleaning composition suitable on glass, chrome, plastic, enamel, and other hard surfaces. The composition is applied to the hard surface as an emulsion of an aqueous phase and an oil phase, which emulsion breaks when applied, as is apparent from a bubbling action. The bubbling action is caused by the evaporation of volatile constituents from the film or layer of applied composition, as well as the desire for the aqueous and oil phase components to reform. It is believed that the bubbling action, characterized by small bubbles of volatile components erupting from the surface of the composition film, aids in lifting soil from the hard surface. It is further believed that the volatile components, particularly the specified volatile surfactant, are actively engaged in attacking the soil. As an apparent consequence, at least in part, to the bubbling action provided by the composition of the present invention, it has been observed that the rate of cleaning is accelerated, the composition lifting off the soil more rapidly than a nonbubbling composition.

More specifically, the composition comprises a polar organic solvent or mixture of solvents, a nonvolatile surfactant, a volatile surfactant which is an acetylenic alcohol or diol as hereinafter described, a volatile organosiloxane oligomer, and water. Optionally, various adjuvants may be incorporated in the composition. Generally speaking, and while specific constituents will be distributed in each phase, the aqueous phase comprises water and the nonvolatile surfactant, while the oil phase comprises the solvent system, the organosiloxane and the volatile surfactant. The adjuvants may appear in either phase, depending upon the affinity therefor.

The solvent (or solvent mixture), volatile surfactant, organosiloxane, and water constituents are in concentrations adapted to provide an evaporation rate of volatiles from the total composition on the surface to be cleaned that is conducive to obtain the bubbling action, and further to provide an evaporation rate of the total composition from the surface to be cleaned that is suitable for a hard surface cleaner. The organosiloxane constituent is an emulsifier, while the volatile surfactant has emulsion-breaking properties, the two in combination providing a short-lived emulsion which is formed upon shaking or mixing of the two phases of the composition. By proper adjustment of the concentrations of the volatile surfactant and the organosiloxane and of the solvent and water constituents, a composition is obtained in which the individual phases, when mixed, form an emulsion that, although quite short-lived on the hard surface in view of the thinness of the layer and surface tensions of the composition, are sufficiently stable within the mixing container as to allow application of the composition over a period of time without repeated shaking of the container.

The Nonvolatile Surfactant

Although not a critical component the nonvolatile surfactant is greatly preferred in view of its detersive properties and because it assists in solubilizing the silicone constituent. The nonvolatile surfactant is selected from the group consisting of anionic, nonionic, amphoteric and zwitterionic surfactants having detersive properties and generally found useful in hard surface cleaners. Mixtures thereof may be incorporated in the subject composition. Amphoteric and zwitterionic surfactants may be incorporated, although these surfactants are not generally used in hard surface cleaners. Although cationic surfactants might also be incorporated, the detersive properties of most cationics are limited. Furthermore, cationic surfactants are known to be generally incompatible with anionic surfactants. For this reason, compositions of the present invention would not typically incorporate both an anionic and cationic surfactant.

Anionic and nonionic nonvolatile surfactants are preferred, and examples thereof are well known. Such surfactants are available in liquid form, as 100% active materials or as materials having an inert organic or aqueous solvent therefor, and in solid form, typically as 100% active powders, flakes, granules, and the like.

Anionic surfactants suitable for incorporation in the compositions of the present invention include the water-soluble salts, especially the alkali metal salts, of sulfates and sulfonates of fatty acids and alcohols and the water-soluble alkali metal salts of the alkyl aryl sulfonates. More specifically, the anionics include, in the salt form, alkyl sulfates of 8 to 22 carbons, preferably 12 to 18 carbons; alkoxy (polyalkoxy) sulfates wherein the alkyl portion has between 12 and 18 carbon atoms and the alkoxy portion has from 1 to about 10 repeating units, the alkoxy portion most preferably being ethoxy of from 1 to 5 repeating units; alkyl phenoxypolyalkoxy sulfates wherein the alkyl portion has from about 8 to about 16 carbon atoms and the alkoxy portion is selected from the group of ethoxy and propoxy, the number of repeating units thereof being between 1 and 10, the alkoxy portion preferably being ethoxy of 1 to 5 repeating units; sulfonated alkyl and alkylaryl alkoxylates wherein the alkyl portion and the alkoxy portions are as previously set forth for the alkoxy (polyalkoxy) sulfates and alkyl phenoxypolyalkoxy sulfates, respectively; hydroxy alkane sulfonates wherein the alkane is from 12 to 18 carbon atoms; alpha-olefin sulfonates and alkyl benzene sulfonates, especially linear alkyl benzene sulfonates, the alkyl of which has from 10 to 18 carbon atoms; sulfated monoglycerides, and sulfosuccinates, for example, the reaction product of malic acid esters with sodium bisulfate. Most preferably, the anionic surfactant is sodium lauryl sulfate or dodecyl benzene sulfonate.

The nonvolatile nonionic surfactants suitable for incorporation in the composition of the present invention include the polyethylene oxide and polypropylene oxide ethers of fatty alcohols and polyethylene and polypropylene oxide ethers of fatty acids, wherein the alkyl group has from 8 to 22 carbon atoms, preferably from 10 to 18 carbons, and the number of ethylene or propylene oxide units is from 1 to about 50, preferably from about 2 to about 15; polyoxythylene oxide ethers of alkyl phenols, wherein the alkyl has from 6 to 16 carbons, and the number of repeating ethylene oxide units is from 6 to about 25, preferably from 8 to 15; the condensation reaction product of ethylene or propylene oxide with an alkyl or aryl amine or an alkyl or aryl amide, and alkyloamides.

The amount of nonvolatile surfactant may vary in accordance with the desired degree of detersiveness of the composition, and will depend on the detersive strength of the surfactant incorporated. The surfactants may be used singly or in admixture of two or more to further obtain the desired properties of the composition. In general, however, the nonvolatile surfactant is less than about 2.5% of the composition by weight. Preferably, the surfactant level is between about 0.01 to about 0.5% by weight, most preferably from about 0.025 to about 0.25% by weight.

The Solvent System

The composition of the present invention contains from about 2 to about 10% by weight of a polar organic solvent having a boiling point in the range of from about 75° C. to about 250° C. or a mixture such of polar solvents. Preferably, the solvent is selected from the group consisting of aliphatic alcohols of from two to six carbon atoms; alkylene or polyalkylene glycols having two to six carbon atoms, and lower alkyl ethers of alkylene or polyalkylene glycols, the alkyl ether moiety thereof having one to four carbon atoms and the total number of carbon atoms in the molecule being from three to eight.

Suitable aliphatic alcohols include ethyl alcohol, isopropyl alcohol, n-propyl alcohol, sec-butyl alcohol, tert-butyl alcohol, hexanol, and cyclohexanol. Preferably, the aliphatic alcohols have a boiling point of from about 75° C. to about 100° C. and from two to four carbon atoms. Hence, ethyl, propyl, and butyl alcohols are preferred, with isopropyl alcohol being most preferred.

Preferably, the alkylene and polyalkylene glycols have from two to six carbon atoms, while the lower alkyl ethers of alkylene or polyalkylene glycols have a total of three to eight carbon atoms, with from one to four carbon atoms contained in the alkyl ether portion. Suitable examples of these compounds are ethylene glycol, propylene glycol, trimethylene glycol, 1,2-butanediol, 1,3-butanediol, tetramethylene glycol, 1,2-pentanediol, 1,4-pentanediol, pentamethylene glycol, 2,3-hexanediol, hexamethylene glycol, glycol monoethyl ether, ethylene glycol monobutyl ether, diethylene glycol monoethyl ether, and mixtures thereof. Especially preferred is ethylene glycol monobutyl ether.

The amount of polar organic solvent in the composition of the present invention is from about 2% to about 10%, preferably from about 4% to about 8%, most preferably from about 6.0 to 7.0%, by weight. It is also preferred to provide as the polar solvent a mixture of a low-boiling and a high-boiling solvent, the low-boiling solvent having a boiling point in the range of from about 75° to about 100° C., and the high-boiling solvent having a boiling point of from about 100° to about 250° C. By providing a mixture of solvents, i.e., a solvent system, it is possible to obtain an optimal evaporation rate of the solvent from the surface to which the composition is applied.

The solvent system incorporated in the preferred embodiment of the invention comprises from about one part to about five parts of the aliphatic alcohol to about one part of a second organic solvent selected from the group consisting of said alkylene glycol or polyalkylene glycol and said lower alkyl ethers of alkylene glycol or polyalkylene glycol, the solvent system being from about 2 to about 10% by weight of the composition, preferably from about 4 to about 8%, most preferably from about 6 to about 7%, by weight.

An especially preferred solvent system comprises about three parts isopropyl alcohol and about two parts ethylene glycol monobutyl ether, the system being incorporated into the composition in amounts as recited above.

The Volatile Surfactant

The volatile surfactant of the present invention has the formula:

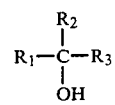

wherein $R_1$ is an alkynyl of from two to about five carbons; $R_2$ is hydrogen or an alkyl of less than four carbons, and $R_3$ is an alkyl or hydroxy alkyl of from one to eight carbons, the total number of carbons in the molecule being from four to twelve. The volatile surfactant is present in an amount of from about 0.1 to about 2.0% by weight, preferably from about 0.5 to about 1.5% by weight. The volatile surfactant is incorporated to allow the emulsion formed on shaking of the composition to break and as a wetting agent to allow the composition to spread evenly on the hard surface and to assist in the penetration of the soil by the composition.

A particularly suitable volatile surfactant in the class described above is 3,5-dimethyl-1-hexyn-3-ol, which has the formula HC≡COH(CH$_3$)CH$_2$(CH$_3$)$_2$ and is manufactured by Air Products and Chemicals, Inc. under the trade name Surfynol 61. This surfactant is available in liquid form as a 100% concentrate. This dimethyl hexyn-ol is only slightly soluble in water, but is very soluble in alcohol and other polar organic solvents. As indicated in U.S. Pat. No. 3,095,381 to Tinnon at column 4, lines 45–48, 3,5-dimethyl-1-hexyn-3-ol is useful as an emulsion breaker.

The Volatile Organosiloxane Constituent

The volatile organosiloxane constituent is a liquid organosiloxane oligomer having from three to nine repeating units, and may be linear, crosslinked, or cyclic in character. The siloxane oligomer is volatile, having a boiling point of from about 134° C. to about 250° C. This constituent forms the emulsion between the solvent phase and the aqueous phase on shaking of the composition and, as the emulsion breaks in the film of composition on the hard surface, further provides good lubricity. In addition, the organosiloxanes have defoaming properties, which properties are advantageous in hard surface cleaners, especially where the nonvolatile surfactant is an anionic surfactant, which has a tendency to foam or suds.

The organosiloxane constituent is present in an amount of from about 0.1 to about 2.0% by weight, preferably from about 0.5 to 1.5% by weight, of the composition. The preferred organosiloxane is the cyclic tetramer of dimethyl siloxane which has the formula [(CH$_3$)$_2$SiO]$_4$, and which is available from Union Carbide Corporation under the trade name Silicone 7207. The boiling point of the tetramer is about 175° C.

The ratio of the volatile surfactant to the volatile organosiloxane should generally be between about 3:1 to about 1:3, preferably between 2:1 and 1:2. Within these ratios and at the solvent levels identified above, two phase compositions that form the breakable emulsion upon shaking are obtainable. It should be understood, however, that even within these ratios the degree of the bubbling action will vary.

Optional Constituents

Other adjuvants generally includable in hard surface cleaners can be incorporated in the compositions of the present invention, for example, dye, perfume, builder salts, alkalinity agents, buffering agents, and the like. Typically, these adjuvants are present in amounts of from 0 to about 1.0% by weight, on an active constituent basis.

The dye and perfume are added to improve the aesthetics of the composition, while the builder salts and alkalinity agents are functional adjuvants in that the efficacy of the composition is improved by their inclusion. Certain builders are inherent alkalinity agents, the increase in the pH of the composition provided by the incorporation thereof improving the efficacy of the nonvolatile surfactant, as is known in the art. Other builders (or the same builders) may also provide chelating or sequestering properties, if desired. Still other builders may provide buffering properties.

The builders useful for incorporation in the composition include the ammonium and alkali metal carbonate, citrate, phosphate, and silicate salts, preferably the sodium salts thereof, for example, sodium carbonate, sodium citrate, sodium silicate, sodium tripolyphosphate, tetrasodium phosphate, and trisodium phosphate; trisodium nitrilotriacetate monohydrate; low molecular weight of polyacrylic resins, for example, Acrysol LMW polyacrylics available from Rohm and Haas Corporation, which have molecular weights in the range of about 500 to about 8000, preferably at least partially neutralized with an alkali metal or ammonium hydroxide; the alkali metal salts, especially the sodium salt, of ethylene diamine tetraacetic acid, and ammonium hydroxide. Although useful, phosphates, which are not biodegradable, are not preferred in view of Federal and/or state governmental restrictions and/or prohibitions on their use in detergent and other cleaning compositions. Similarly, silicates are not preferred where the composition is to be applied to glass surfaces in view of the hard-to-remove film that can be formed if the composition is allowed to dry without wiping, a misuse condition.

Ammonium hydroxide and trisodium nitrilotriacetate monohydrate are preferred builders for use herein. Most preferably, a builder system is incorporated comprising on an active weight percent basis from about 1 to about 10 parts ammonium hydroxide to 1 part trisodium nitrilotriacetate monohydrate, this system being incorporated at a level from about 0.1 to about 0.5% by weight of the composition.

Preparation of the Composition

Although the constituents may be admixed in any sequence to obtain the present composition, it is preferred to first prepare the solvent-phase constituents in a premix and then to add water to provide the aqueous phase.

Concentrate

The composition of the present invention may be formed by the user by dilution with water of a concentrate, the concentrate composition being said composition hereinabove described less the amount of make-up water to be added. The amount of water added to the concentrate is up to about ten times the weight of the concentrate, preferably less than five times the weight of the concentrate.

Use of the Composition

The composition, in final form, may be used by shaking or otherwise admixing the aqueous and solvent phases together to form the emulsion, applying the thus-formed emulsion to the hard surface, and then wiping the hard surface with a sponge, cloth or paper towel. On contact with the hard surface, the emulsion begins to break and the volatile constituents begin to evaporate, as characterized by a bubbling action occurring at the surface of the film applied to the hard surface to be cleaned. This bubbling action continues until the volatile constituents have essentially evaporated or the emulsion has broken. It is believed that the bubbling action, which is not associated with foaming or sudsing of the nonvolatile surfactant, assists in lifting soil from the surface.

Depending on the concentrations of the constituents, specifically, the solvent, siloxane and volatile surfactant constituents, the vigor of the bubbling action may be regulated and optimized. Although the emulsion formed by shaking is not stable for long time periods, it is relatively stable in the container over normal use intervals, and does not require repeated shaking. Occasionally, however, the user may be required to shake the container to reconstitute the emulsion. Although relatively stable within the container, the emulsion, when applied to the surface, in view of the surface tension of the film of emulsion, is unstable. Hence, it is not necessary for the user to provide a long time period for the film of emulsion to commence breaking or evaporating. Generally, several seconds, the time normally allotted by the user with conventional hard surface cleaners, is a sufficient time period to obtain the benefits and advantages of the present invention, which are illustrated in the examples which follow.

EXAMPLE 1

The following composition was prepared:

|  | % By Weight |
| --- | --- |
| Surfynol 61 | 1.0 |
| Sodium Lauryl Sulfate | 0.45 |
| Silicone 7207 | 0.5 |
| Isopropyl Alcohol | 4.0 |
| Ethylene Glycol Monoethyl Ether | 2.5 |
| Nitrilotriacetate | 0.04 |
| Ammonium Hydroxide (26° Be) | 0.60 |
| Perfume | 0.02 |
| D.I. Water | Q.S. |
| Total | 100.00 |

This formulation was applied as drops (i.e., a static test) on a greased slide. A bubbling action was observed. In viewing the slide through a microscope it appeared that the grease and composition were physically interacting. The formulation was removed by rinsing with deionized water.

A similar static grease test was conducted on plates soiled with beef fat and aged for three days and on similarly soiled plates baked in an oven for one hour at 100° C. The composition was removed from the plate by rinsing with deionized water and the slides rated visually as to cleaning efficiency, as tabulated below.

| Contact Time | % Cleaning | |
|---|---|---|
| (seconds) | Aged Soil | Baked Soil |
| 5 | 90 | — |
| 10 | 95 | — |
| 20 | 100 | — |
| 60 | — | 70 |
| 120 | — | 100 |

EXAMPLE 2

The compositions in Table I were prepared and evaluated as to cleaning efficiency using clear glass panels streaked with grease pencil. Composition I is not in accordance with the subject invention in that this composition contained no silicone, and therefore did not exhibit the bubbling action. In this test the panels were cleaned with 20 cycles in a Gardner washability machine, and the cleaning score values based on the blind rating of three replicates by eleven judges. In addition a static test on beef fat aged one day was conducted for some of these compositions wherein a one milliliter aliquot of composition was applied to a one foot square mirror and rinsed with deionized water after 10 seconds. The percent grease removed was estimated and is recorded in Table I.

TABLE I

| Example | A | B | C | D | E | F | G | H | I |
|---|---|---|---|---|---|---|---|---|---|
| Composition | | | | | | | | | |
| Surfynol 61 | 0.5 | 0.5 | 0.5 | 1.0 | 1.0 | 1.5 | 1.0 | 1.0 | 1.0 |
| Silicone 7207 | 0.5 | 1.0 | 1.5 | 0.5 | 1.0 | 0.5 | 0.5 | 0.5 | 0.0 |
| Sodium Lauryl Sulfate | 0.045 | 0.045 | 0.045 | 0.045 | 0.045 | 0.045 | 0.045 | 0.045 | 0.045 |
| Isopropyl Alcohol | 4.0 | 4.0 | 4.0 | 4.0 | 4.0 | 4.0 | 2.15 | 4.3 | 4.0 |
| Ethylene Glycol Monobutyl Ether | 2.5 | 2.5 | 2.5 | 2.5 | 2.5 | 2.5 | 1.34 | 2.68 | 2.5 |
| Nitrilotriacetate | 0.04 | 0.04 | 0.04 | 0.04 | 0.04 | 0.04 | 0.04 | 0.04 | 0.04 |
| Ammonium Hydroxide (26° Be) | 0.60 | 0.60 | 0.60 | 0.60 | 0.60 | 0.60 | 0.60 | 0.60 | 0.60 |
| Perfume | 0.02 | 0.02 | 0.02 | 0.02 | 0.02 | 0.02 | 0.01 | 0.02 | 0.02 |
| D.I. Water | Q.S. 100% | Q.S. 100% | Q.S. 100% | Q.S. 100% | Q.S. 100% | Q.S. 100% | Q.S. 100% | Q.S. 100% | Q.S. 100% |
| Cleaning Score Grease Pencil | 77 | 110 | 110 | 127 | 129 | 123 | 111 | 127 | 100 |
| Cleaning Score Beef Fat | 15 | — | — | 78 | 83 | — | 90 | 100 | 75 |

I claim:
1. A hard surface cleaning composition forming upon agitation an unstable emulsion breakable when applied to the hard surface to be cleaned, the composition comprising on a weight basis:
   (a) from about 2 to about 10% of an organic polar solvent having a boiling point in the range of from about 75° to 250° C.;
   (b) from 0 to about 2.5% of a nonvolatile surfactant selected from the group consisting of anionic, nonionic, amphoteric, and zwitterionic surfactants;
   (c) from 0.1 to about 2.0% of a volatile organosiloxane oligomer having a boiling point in the range of from about 134° to about 250° C.;
   (d) from about 0.1 to about 2.0% of a volatile surfactant having the formula

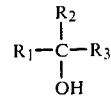

wherein $R_1$ is an alkynyl of from 2 to 5 carbons; $R_2$ is hydrogen or an alyl of less than 4 carbons, and $R_3$ is an alkyl or hydroxy alkyl of from 1 to 8 carbons, the total number of carbons in the molecule being from 4 to 12, and
   (e) the remainder water, the ratio of said volatile surfactant to said organosilaxane oligomer being from about 3:1 to about 1:3.

2. The composition of claim 1 wherein the organic polar solvent is selected from the group consisting of: aliphatic aclohols of from two to six carbon atoms; alkylene and polyalkylene glycols having two to six carbon atoms, and alkyl ethers of alkylene of polyalkylene glycols having three to eight carbon atoms, the alkyl ether moiety thereof having one to four carbon atoms.

3. The composition of claim 2 wherein the nonvolatile surfactant is selected from the group of anionic and nonionic surfactants, said nonvolatile surfactant being present in an amount of from about 0.01 to about 2.5% by weight.

4. The composition of claim 3 wherein the nonvolatile surfactant is (a) an anionic surfactant selected from the group consisting of alkali metal and ammonium salts of alkyl sulfates of from 8 to 22 carbons; alkali metal salts of alkoxy (polyalkoxy) sulfates wherein the alkyl has from 12 to 18 carbons and the alkoxy has from 1 to 10 repeating units; alkali metal alkyl phenoxypolyalkoxy sulfate salts wherein the alkyl has from 8 to 17 carbons, and the alkoxy is ethoxy or propoxy and has from 1 to 10 repeating units; alkali metal salts of sulfonated alkyl polyalkoxylates wherein the alkyl has from 12 to 18 carbons and the alkoxy has from 1 to 10 repeating ethoxy or propoxy units; alkali metal salts of sulfonated alkylaryl alkoxylates wherein the alkyl has from 8 to 16 carbons, and the alkoxy is ethoxy or propoxy and has 1 to 10 repeating units; hydroxy alkane sulfonates of 12 to 18 carbons; alpha-olefin sulfonates of 10 to 18 carbons; alkyl benzene sulfonates, the alkyl having from 10 to 18 carbons; sulfonated monoglycerides, and sulfosuccinates; (b) a nonionic surfactant selected from the class consisting of polyethylene oxide and polypropylene oxide ethers of fatty acids, the alkyl of which has 8 to 22 carbons, and the number of repeating units is from 1 to about 50; polyoxyethene oxide ethers of alkyl phenols wherein the alkyl has from 6 to 16 carbons and the number of repeating units is from 6 to about 25; the condensation reaction product of ethylene or propylene oxide with an alkyl or aryl amine or an alkyl or aryl amide, and alkylolamines, and (c) a mixture of (a) and (b).

5. The composition of claim 1 wherein the volatile surfactant is an acetylenic tertiary monohydric alcohol.

6. The composition of claim 5 wherein the organosiloxane is a dimethyl siloxane cyclic tetramer.

7. The composition of claim 5 wherein the volatile nonionic surfactant is 3,5-dimethyl-1-hexyne-3-ol.

8. The composition of claim 6 wherein the nonvolatile surfactant is selected from the group consisting of sodium lauryl sulfate, sodium lauryl ether sulfate, sodium dodecyl benzene sulfonate, and octyl phenoxy (polyethoxy) ethanol having one to ten moles of ethylene oxide.

9. The composition of claim 8 wherein the nonvolatile surfactant is present in the amount of from about 0.01 to about 0.5%.

10. The composition of claim 8 wherein the volatile surfactant is 3,5-dimethyl-1-hexyne-3-ol.

11. The composition of claim 8 wherein the polar organic solvent is a solvent system comprising from about one to about five parts of a low boiling point solvent which is an aliphatic monohydric alcohol of two to four carbons, and about one part of a high boiling point solvent which is selected from the group consisting of alkylene and polyalkylene glycols and alkyl ethers of alkylene or polyalkylene glycols.

12. The composition of claim 11 wherein the volatile surfactant is 3,5-dimethyl-1-hexyne-3-ol.

13. The composition of claim 12 wherein the volatile surfactant is present in the amount of from about 0.5 to about 1.5%.

14. The composition of claim 13 wherein the organosiloxane is present in the amount of from about 0.50 to about 1.5%.

15. The composition of claim 14 wherein the solvent is present in the amount of from about 4 to about 8%.

16. The composition of claim 10 wherein the nonvolatile surfactant is sodium lauryl sulfate present in the amount of from about 0.01 to about 0.5%.

17. The composition of claim 15 wherein the nonvolatile surfactant is sodium lauryl sulfate present in the amount of from about 0.01 to about 0.5%.

18. The composition of claim 15 wherein the solvent contains from one to three parts isopropyl alcohol and one part ethylene glycol monobutyl ether.

19. The composition of claim 18 wherein the solvent is present in an amount of from about 6 to about 7%; wherein the nonvolatile surfactant is sodium lauryl sulfate present in an amount of from 0.025 to 0.25%; and wherein each of the organosiloxane and the volatile surfactant are present in an amount of about 1%.

20. The composition of claim 14 wherein the ratio of volatile surfactant to organosiloxane is between 2:1 to 1:2.

21. The composition of claim 1 further comprising an alkylinity agent in an amount of less than about 1.5%.

22. The composition of claim 21 wherein the alkalinity agent is ammonium hydroxide.

23. The composition of claim 1 further comprising a builder salt in an amount of less than 1.0%.

24. The composition of claim 23 wherein the builder salt is in an amount of less than 0.5%, the salt being selected from the group consisting of trisodium nitrilotriacetate, ethylenediamine tetraacetic acid, sodium borate and sodium citrate.

25. The composition of claim 24 further comprising an alkalinity agent in an amount of from about 0.1% to 1%.

26. The composition of claim 25 further comprising an effective amount of at least one of the following adjuvants: dye, perfume, and buffering agent.

27. A method of cleaning a hard surface comprising the steps of shaking the composition of claim 1 to obtain a breakable emulsion, applying the emulsion to the hard surface, and shortly thereafter wiping the surface with a cloth, sponge, or towelette.

28. The method of claim 27 wherein the composition is that specified in claim 5.

29. The method of claim 27 wherein the composition is that specified in claim 14.

* * * * *